United States Patent
Sugitani et al.

(10) Patent No.: US 6,573,517 B1
(45) Date of Patent: Jun. 3, 2003

(54) ION IMPLANTATION APPARATUS

(75) Inventors: Michiro Sugitani, Niihama (JP); Mitsukuni Tsukihara, Ehime (JP); Yoshitomo Hidaka, Yokohama (JP); Mitsuaki Kabasawa, Saijo (JP); Kouji Inada, Toyo (JP)

(73) Assignee: Sumitomo Eaton Nova Corporation, Tanashi (JP)

( * ) Notice: Subject to any disclaimer, the term of this patent is extended or adjusted under 35 U.S.C. 154(b) by 250 days.

(21) Appl. No.: 09/629,622

(22) Filed: Jul. 31, 2000

(30) Foreign Application Priority Data

Jul. 30, 1999 (JP) ............................. 11-217453

(51) Int. Cl.[7] .......................... H01J 37/08; H01J 49/28; H01J 49/00; H01J 49/30; G21G 5/00
(52) U.S. Cl. ........................ 250/492.21; 250/492.2; 250/492.22; 250/294; 250/296; 250/298; 250/396 R
(58) Field of Search ................. 250/492.2, 492.21, 250/281–284, 288, 288 A, 294, 295, 297, 298, 423 R; 315/111.81, 5.41, 505; 324/466, 459, 464

(56) References Cited

U.S. PATENT DOCUMENTS

| | | | | |
|---|---|---|---|---|
| 3,585,397 A | * | 6/1971 | Brewer | 250/49.5 |
| 3,786,359 A | * | 1/1974 | King | 328/233 |
| 4,536,652 A | * | 8/1985 | Cooks et al. | 250/281 |
| 4,560,879 A | * | 12/1985 | Wu et al. | 250/492.2 |
| 4,638,160 A | * | 1/1987 | Slodzian et al. | 250/296 |
| 4,682,026 A | * | 7/1987 | Douglas | 250/288 |
| 4,839,523 A | * | 6/1989 | Taya et al. | 250/492.2 |
| 4,881,010 A | * | 11/1989 | Jetter | 315/111.81 |
| 5,134,301 A | * | 7/1992 | Kamata et al. | 250/492.2 |
| 5,216,253 A | * | 6/1993 | Koike | 250/492.2 |
| 5,306,922 A | * | 4/1994 | O'Connor | 250/492.21 |
| 5,327,475 A | * | 7/1994 | Golovanivsky et al. | 378/34 |
| 5,552,599 A | * | 9/1996 | Giessmann et al. | 250/281 |
| 5,572,024 A | * | 11/1996 | Gray et al. | 250/288 |
| 5,783,823 A | * | 7/1998 | Mous et al. | 250/281 |
| 5,801,488 A | * | 9/1998 | Fujisawa | 315/5.41 |
| 5,883,391 A | * | 3/1999 | Adibi et al. | 250/492.21 |
| 5,932,882 A | * | 8/1999 | England et al. | 250/492.21 |
| 5,962,849 A | * | 10/1999 | Saito et al. | 250/287 |
| 5,969,366 A | * | 10/1999 | England et al. | 250/492.21 |
| 6,031,379 A | * | 2/2000 | Takada et al. | 324/466 |
| 6,093,625 A | * | 7/2000 | Wagner et al. | 438/514 |
| 6,130,436 A | * | 10/2000 | Renau et al. | 250/492.21 |
| 6,229,148 B1 | * | 5/2001 | Prall et al. | 250/492.21 |
| 6,313,475 B1 | * | 11/2001 | Renau et al. | 250/492.21 |
| 6,319,734 B1 | * | 11/2001 | Matsuda | 438/14 |

FOREIGN PATENT DOCUMENTS

| | | | | |
|---|---|---|---|---|
| JP | 404282547 A | * | 10/1992 | H01J/37/317 |
| JP | 405006754 A | * | 1/1993 | H01J/37/317 |
| JP | 405325873 A | * | 12/1993 | H01J/37/317 |

(List continued on next page.)

OTHER PUBLICATIONS

E.W. Blauth, "Dynamic Mass Spectrometers", Elsevier Publ. Co. 1966, pp. 1–9.*

Primary Examiner—John R. Lee
Assistant Examiner—Bernard E. Souw

(57) ABSTRACT

An ion injecting apparatus has an ion source, a mass-analyzing magnet, an accelerating/decelerating element, and deflecting elements. The mass analyzing magnet mass-analyzes an ion beam extracted from the ion source. The accelerating/de-celerating element accelerates and decelerates the ion beam at a post-stage. The deflecting elements are arranged between the mass analyzing magnet and the accelerating/decelerating element. Each direction angle of the deflecting element is determined such that a final beam trajectory in the predetermined area before being introduced into a wafer substrate is matched to each other in both an operating mode and a non-operating mode of the deflecting elements.

14 Claims, 6 Drawing Sheets

FOREIGN PATENT DOCUMENTS

| | | | | |
|---|---|---|---|---|
| JP | 06168697 A | * | 6/1994 | ............ H01J/37/04 |
| JP | 09045273 A | * | 2/1995 | .......... H01J/37/317 |
| JP | 09199440 A | * | 7/1997 | ............ C23C/14/48 |
| JP | 10163678 | * | 6/1998 | .......... H01J/37/317 |
| JP | 10211981 | * | 7/1998 | .......... H01J/37/317 |
| JP | 10208687 A | * | 8/1998 | ............ C23C/14/48 |
| JP | 11329316 A | * | 11/1999 | ............ C23C/14/48 |
| JP | 02000174266 A | * | 6/2000 | ............ H01L/29/78 |

* cited by examiner

[EXAMPLE OF ENERGY CONTAMINATION]

ION IMPLANTATION APPARATUS

BACKGROUND OF THE INVENTION

This invention relates to an ion implantation apparatus and, in particular, to an ion implantation apparatus which is capable of producing an ion beam having no energy contamination.

In a recent ion implantation process for semiconductor device production, implantation energy has been getting lower and lower to make the depth of implanted ions shallower with scale reduction of micro patterning of the semiconductor device.

Extraction voltage of ion source is lowered to generate the low energy ions. However, the lower the extraction voltage is, the worse the extraction efficiency of ions from ion source is.

Further, the ions repel each other due to electric charge of themselves. This mutual repulsion causes a rapid increase of the ion beam diameter. This is what is called "Space charge effect". This effect becomes stronger with the decrease in ion energy. Consequently, transport efficiency is also reduced in low energy region. As a result, enough ion beam current can not be obtained.

To compensate for this difficulty, so called, post-deceleration technology has been used conventionally. In this technology, the ions are extracted from the ion source at a relatively high extraction voltage, and are mass analyzed and transported near to the target wafers, then the ions are decelerated down to the desired energy by a reverse electric field.

In such a deceleration method, there is an advantage that relatively higher beam current of low energy ions can be obtained easily. However, if the ions are neutralized by the reaction with residual gas before the deceleration position, such neutralized particles can not be decelerated by the reverse electric field. Consequently, such neutralized particles are implanted into the target wafer with original energy that is different from desired energy. This phenomenon is what is called "Energy contamination".

Similar phenomena occur also in post-acceleration method in which the ions are accelerated by a forward electric field after mass analyzing to obtain higher energy ion beam.

If the ions are neutralized by the reaction with residual gas before the acceleration position, such neutralized particles can not be accelerated by the forward electric field. Consequently, such neutralized particles are implanted into the target wafer with original energy that is different from desired energy.

On the contrary, if the electrons of the ions are stripped more by the reaction with residual gas before the acceleration position, ions become higher valence (multi-charged) ions. Such multi-charged ions are accelerated by the forward electric field the valence times more than the single charged ions and implanted into the target wafer with different energy that is higher than the desired energy.

Thus, the energy contamination often occurs in the apparatus equipped with post-acceleration as well.

Referring to FIG. 1, description will be made about a related ion implantation apparatus equipped with post-deceleration or post-acceleration.

In FIG. 1, an ion beam extracted from an ion source 41 is mass-analyzed by a mass analyzing magnet 42 and a mass analyzing slit 43 to select desired ion species.

Specifically, immediately after the ion beam passes the mass analyzing magnet 42 at a point A, only desired ions exist on a trajectory that can pass through the mass analyzing slit 43.

In this case, energy of the desired ions at the Point A is determined in dependence upon the extraction voltage of the ion source 41 and the valence number of the ion. Therefore, the desired ions, which are on the trajectory towards the mass analyzing slit 43, have no energy dispersion at the point A.

After the ions pass through the mass analyzing slit 43, the ions are decelerated or accelerated in a post-stage electrode portion 44. In this event, the ions are decelerated or accelerated in accordance with a direction of an electric field applied to the post-stage electrode portion 44.

Namely, when a reverse electric field is applied, the ions are decelerated. On the other hand, when a forward electric filed is applied, the ions are accelerated.

The mass analyzing slit 43 is generally located nearby a downstream side of the post-stage electrode portion 44, hence an electrode part of the post-stage electrode portion 44 may perform the function of the mass-analyzing slit 43 in many cases.

As a specific example, description will be made about such a case that boron ions (B+) having one valence are implanted into a silicon wafer 46 in a wafer-processing chamber 45 with the energy less than 1 keV by using the post-deceleration.

In this event, a mode is classified into a first mode (drift mode) and a second mode (deceleration mode).

In the first mode, the ions are extracted from the ion source 41 with an extraction voltage less than 1 kV, and are implanted without the post-deceleration.

In the second mode, the ions are extracted with a relatively higher voltage (for example, n kV), and a reverse electric field is applied to the post-deceleration electrode portion 44 to finally produce the ion having energy less than 1 keV.

In the first mode, the extraction efficiency is degraded because the extraction voltage is low. Further, the transport efficiency is not high because the beam diverges by the space charge effect. Consequently, the beam current becomes small.

In the first mode, the energy contamination does not occur, however the beam current becomes small. In consequence, implantation time becomes long to implant the predetermined implantation quantity.

In the second mode, the current is increased in comparison with the first mode because of relatively higher extraction voltage than the first mode.

For example, when the ions are extracted from the ion source 41 with the voltage of several to 10 kV, the ions are transported towards the post-stage electrode portion 44 with the initial energy of several to 10 keV.

Further, the reverse electric field is applied such that the ions are decelerated down to energy of ½–1/10 at the post-stage electrode portion 44 to finally produce the ion beam with the energy less than 1 keV.

However, a part of ions lose their charge by reaction with residual gas and become neutral particles in an area (an area B in FIG. 1) between the exit position (Point A) of the mass analyzing magnet 42 and a deceleration position.

In consequence, the part of the ions as the neutral particles are not affected by the reverse electric field for the deceleration. Thereby, the ions are implanted with the initial energy of several to 10 keV. As a result, not only the desired boron with the energy less than 1 keV but also the boron ions with the initial energy are inevitably implanted.

Thus, the beam current in the second mode of the deceleration is higher than the first mode, and the implantation time is advantageously short.

On the contrary, the particles not having the desired energy are inevitably mixed. This phenomenon is referred to as the energy contamination.

From the view point of getting the beam current as much as possible, deceleration ratio (namely, a ratio of energy before the deceleration to the energy after the deceleration) is to be desirably higher. However, as the deceleration ratio is higher, content or quantity of the energy contamination is generally higher.

FIG. 2 shows a typical example of implanted profile when the energy contamination takes place by the deceleration of the second mode in comparison with the profile of the first mode.

It is found out that the implanted profile of the second mode has higher energy component which is implanted to deeper position with the energy before deceleration.

To eliminate the components of energy contamination on the ion implantation apparatus with post-deceleration or post-acceleration, additional element for re-deflecting by electric field or magnetic filed has been conventionally used on the downstream trajectory of post-stage electrode.

In particular, this conventional method has been widely used on the apparatus equipped with the post-acceleration.

A structure of another related art is schematically illustrated in FIG. 3 to show the conventional method.

In FIG. 3, an ion beam extracted from an ion source 61 is mass-analyzed by a mass-analyzing magnet 62 and a subsequent mass-analyzing slit 63 to select desired ion species.

More specifically, immediately after the ions pass the mass analyzing magnet 62 at a point A, only the desired ions exist on such a trajectory that they can pass through the mass analyzing slit 63.

After the ions pass through the slit 63, the ions are decelerated or accelerated at a post-stage electrode portion 64.

With such a structure, neutralized particles and multi-charged ions, which are generated in the area B and have the different energy from the desired energy, are separated by a re-deflecting element 67 after post-deceleration/post-acceleration.

Consequently, only ions having the desired energy passes along a desired ion beam trajectory 68 to be introduced into a wafer substrate 66 in a wafer processing chamber 65.

In this case, a deflected ion beam having high valence passes along a trajectory 69a while a beam including neutral particles passes along a trajectory 69b.

The related arts have the following disadvantages.

(1) The additional deflecting element is located at the downstream side of the post-deceleration/post-acceleration element. Thereby, an additional space is required, and a whole size of ion implantation apparatus becomes large.

(2) When low energy ions are obtained in the deceleration (namely, the second mode for the deceleration operation, the transport distance becomes long after the ions are decelerated to the low energy.

Thereby, the beam diverges by the space charge effect. Finally, the beam current decreases, and advantage is lost in the second mode of the deceleration operation.

SUMMARY OF THE INVENTION

It is therefore an object of this invention to provide an ion implantation apparatus which is capable of obtaining an ion beam having no energy contamination in both deceleration/acceleration modes of a post-stage.

An ion implantation apparatus according to this invention has an ion source, a mass-analyzing magnet, an accelerating/decelera-ting element, and deflecting elements.

With this structure, the mass analyzing magnet mass-analyzes an ion beam extracted from the ion source. The deflecting elements deflect the ion beam on the trajectory.

The deflecting elements are arranged between the mass-analyzing magnet and the accelerating/decelerating element.

In this case, the deflecting elements have a certain deflection angle each and have an operating mode and a non-operating mode. Each deflection angle is determined such that a final beam trajectory in a predetermined area before being introduced into a wafer substrate is matched to each other in both the operating mode and the non-operating mode.

The ion implantation apparatus further includes a separating slit arranged at the downstream side of the accelerating/decelerating element to eliminate undesirable particles causing energy contamination.

Further, the deflecting planes of the deflecting elements are substantially equivalent to the deflecting plane of the analyzing magnet.

In this case, deflection due to the deflecting elements are carried out by the use of electric field.

Alternatively, the deflection may be carried out by the use of magnetic field generated by an electromagnet preferably.

A beam trajectory is constituted such that the ion beam is transported to the wafer substrate when the post-acceleration/post-deceleration is not performed by the accelerating/decelerating element and the deflecting elements are not operated.

In the event, the deflecting elements are preferably composed of three stages such that the deflection operation is carried out three times at least. Thereby, the final beam trajectory in the predetermined area before being introduced into the wafer substrate is matched to the trajectory of non-operating mode.

Instead, the deflecting elements may be composed of two stages such that the ion beam is extracted from the mass-analyzing magnet on the trajectory offset from an original trajectory. In the event, preliminary deflection can be carried out by the mass-analyzing magnet.

The beam trajectory is offset by setting magnetic field of the mass-analyzing magnet weaker or stronger than a normal value.

The deflecting elements preferably include a first stage deflecting element and a second stage deflecting element. The mass-analyzing magnet deflects an ion beam trajectory around 90 degrees.

With such a structure, the first stage deflecting element is arranged as close to the mass-analyzing magnet as possible while the final stage deflecting element is arranged as close to the post-stage electrode portion as possible.

The accelerating/decelerating element is desirably arranged immediately after the mass-analyzing slit.

Further, the separating slit may be arranged at the predetermined distance from the accelerating/decelerating element.

In this condition, the mass-analyzing slit is substantially matched with a focal point of the ion beam through the mass-analyzing magnet.

DESCRIPTION OF PREFERRED EMBODIMENTS

First Embodiment

Figure 1:
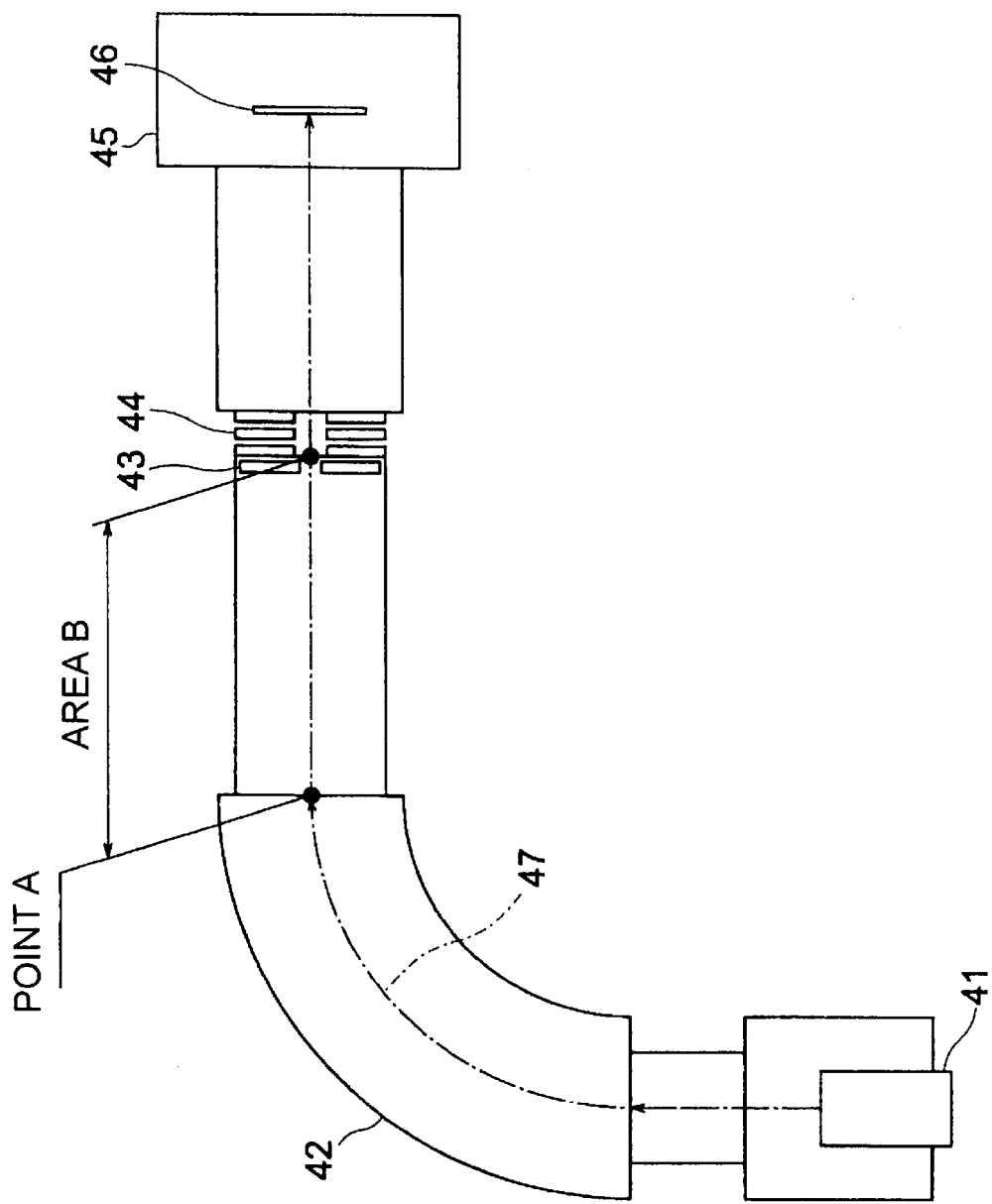
FIG. 1 shows a schematic view showing an ion implantation apparatus according to a related art.
Figure 2:
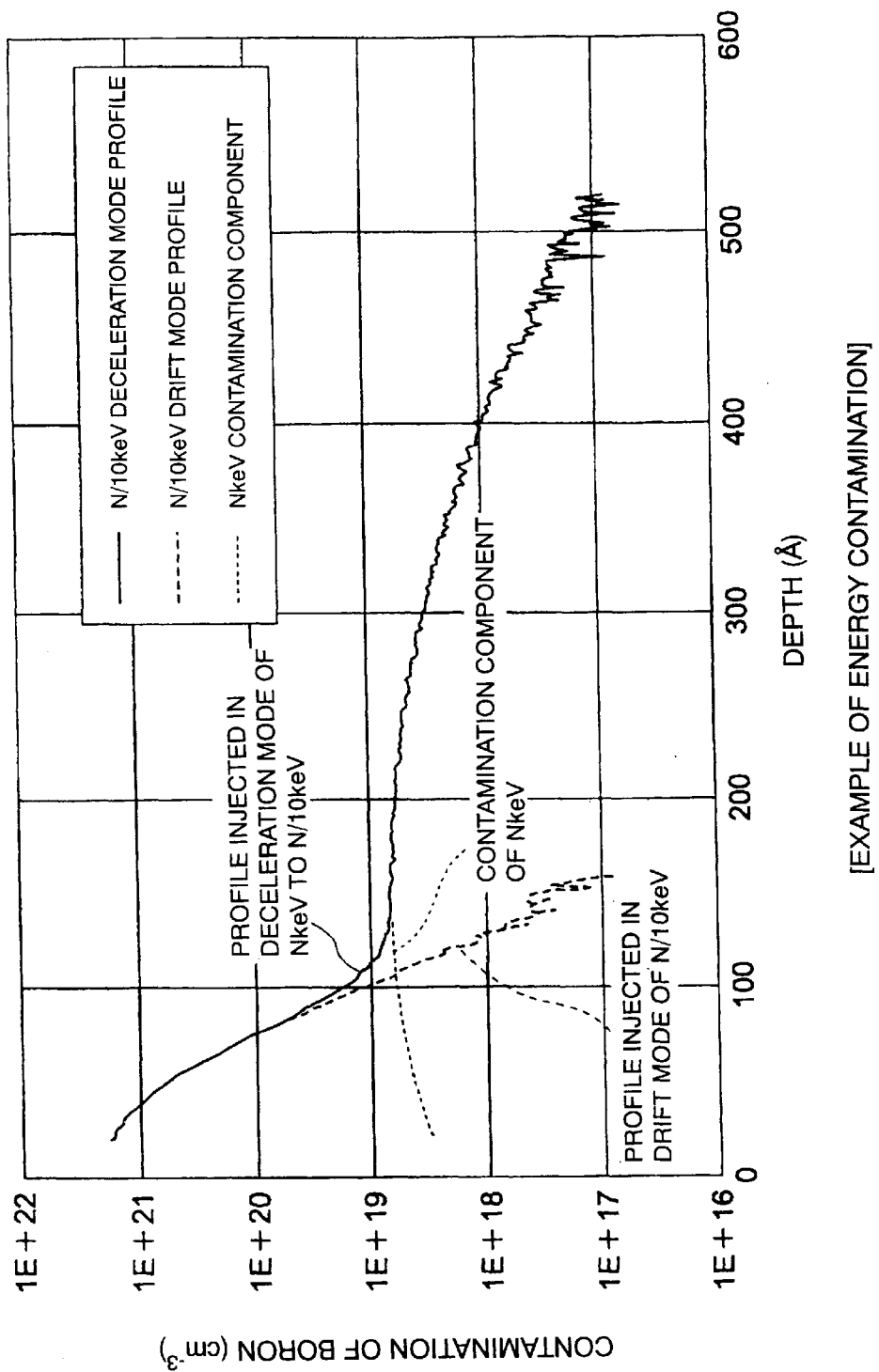
FIG. 2 shows a graph showing an example of energy contamination in an ion implantation apparatus according to a related art.
Figure 3:
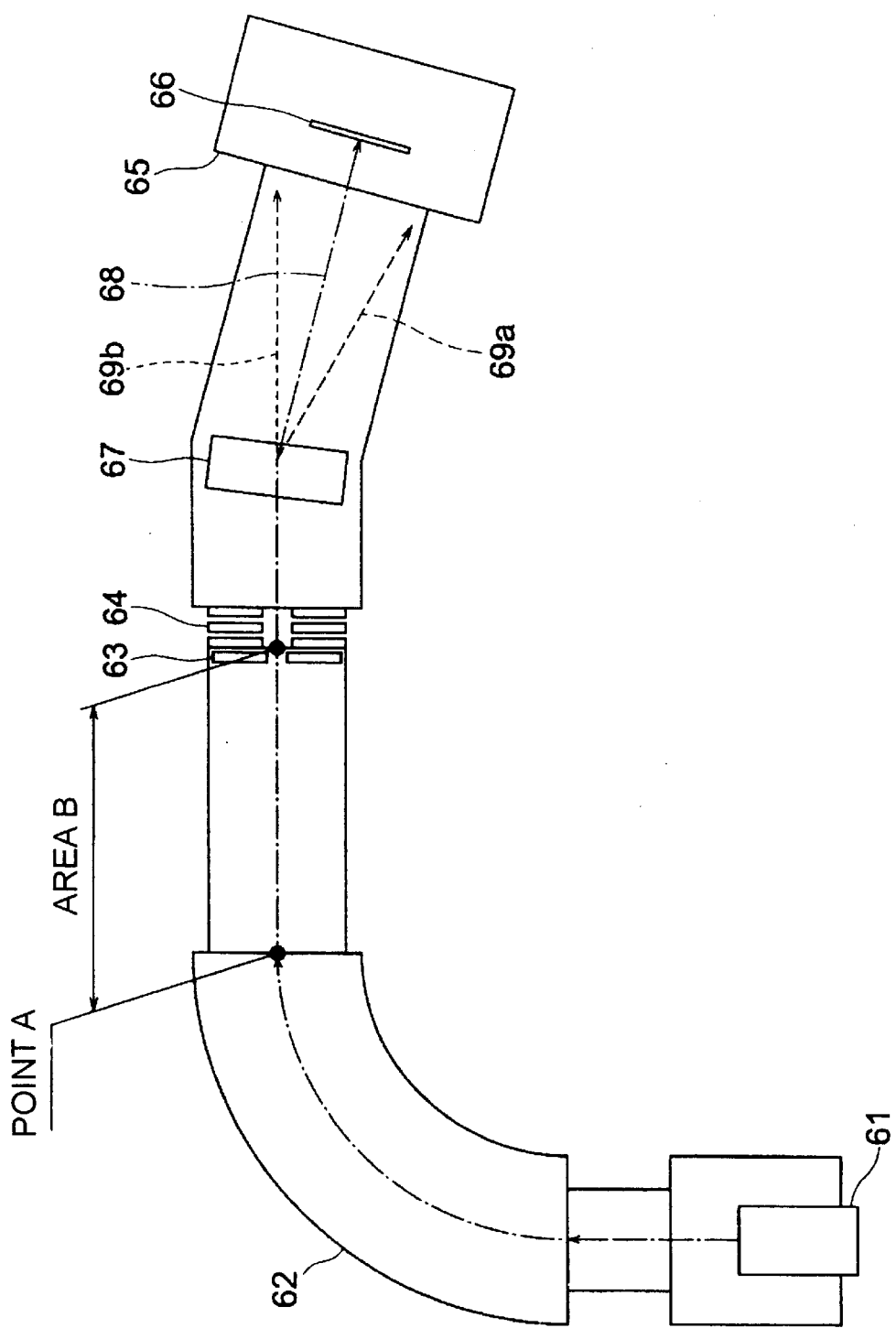
FIG. 3 shows a schematic view showing an ion implantation apparatus according to another related art.
Figure 4:
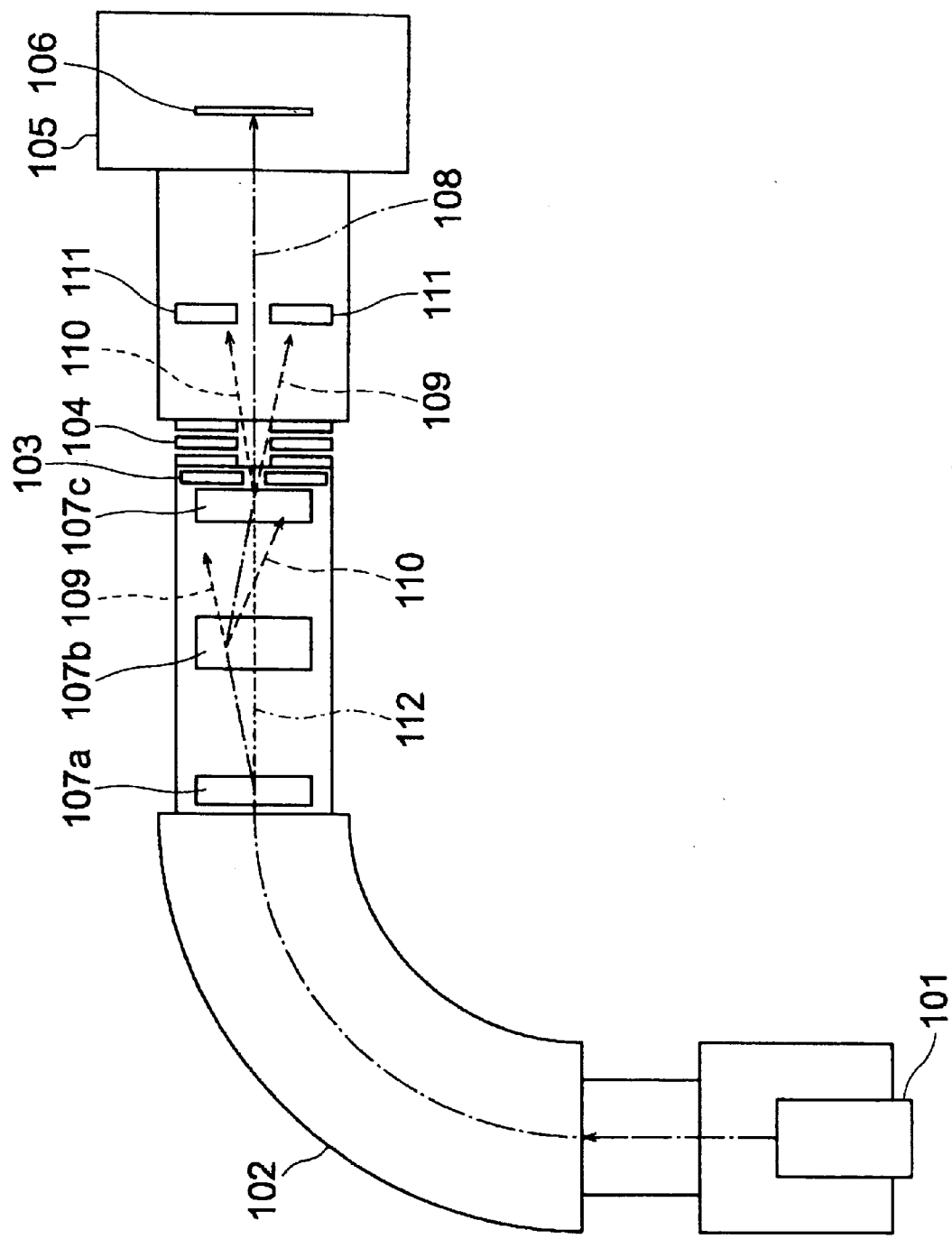
FIG. 4 shows a schematic view showing an ion implantation apparatus according to a first embodiment of this invention.

Referring to FIG. 4, description will be made about a first embodiment of this invention.

In FIG. 4, three stages or more of deflecting elements 107a, 107b, and 107c are arranged between a mass-analyzing magnet 102 and a post-stage electrode portion 104.

A desired ion beam extracted from an ion source 101 is coming off from an initial trajectory by the effect of the first stage deflecting element 107a immediately after the mass-analyzing magnet 102. Thereafter, the ion beam passes through the deflecting element 107b for curving and returning towards the initial trajectory.

Finally, the ion beam is returned onto an initial beam trajectory 112 by the deflecting element 107c immediately before the post-stage electrode portion 104.

On halfway, at least one deflecting element 107b is required to curve and return the ion beam. Consequently, three deflecting devices 107a, 107b, and 107c must be prepared at least.

In the meantime, particles neutralized from ions in the ion beam are not deflected by both electric field and magnetic field.

Particles, which are neutralized from ions in an area between the first deflecting element 107a located immediately after the mass-analyzing magnet 102 and the final deflecting element, are coming off from the trajectory of other normal ions, and are eliminated or lost before the post-stage electrode portion 104.

Alternatively, the neutralized particles collide with slits 111 even when they pass through the post-stage electrode portion 104. In consequence, the neutralized particles finally do not reach the wafer substrate 106 in the wafer-processing portion 105. Herein, it is to be noted that the trajectory 109 represents a beam trajectory of the neutralized particles which are "not deflected" by the deflecting elements.

On the contrary, when the valence of the ion is increased by electron stripping, the ion receives stronger deflecting force than the ion having the desired valence. Consequently, the ions are coming off from the trajectory of other normal ions, and are eliminated or lost before the post-stage electrode portion 104.

Alternatively, the ions collide with the slits 111 even when the ions pass the post-stage electrode portion 104, and finally do not reach the wafer substrate 106 in the wafer-processing chamber 105. Herein, it is to be noted that the trajectory 110 represents a beam trajectory of the higher valence ions which are "largely deflected" by the deflecting elements.

The neutralized particles, which can be eliminated by this method, are generated between the first-stage deflecting element 107a and the final-stage deflecting element 107c.

Therefore, the first-stage deflecting element 107a is arranged as close to the mass-analyzing magnet 102 as possible while the final-stage deflecting element 107c is provided as close to the post-stage electrode portion 104 as possible.

In this method, when the ion implantation apparatus is not operated in post-deceleration or post-acceleration mode, it is unnecessary that the deflecting elements 107a, 107b, and 107c are operated. In this case, the beam trajectory after the mass-analyzing magnet 102 becomes a linear trajectory 112. In this event, the mass analyzing slit 103 may have the function of a part of the post-stage electrode portion 104.

Second Embodiment

Figure 5:
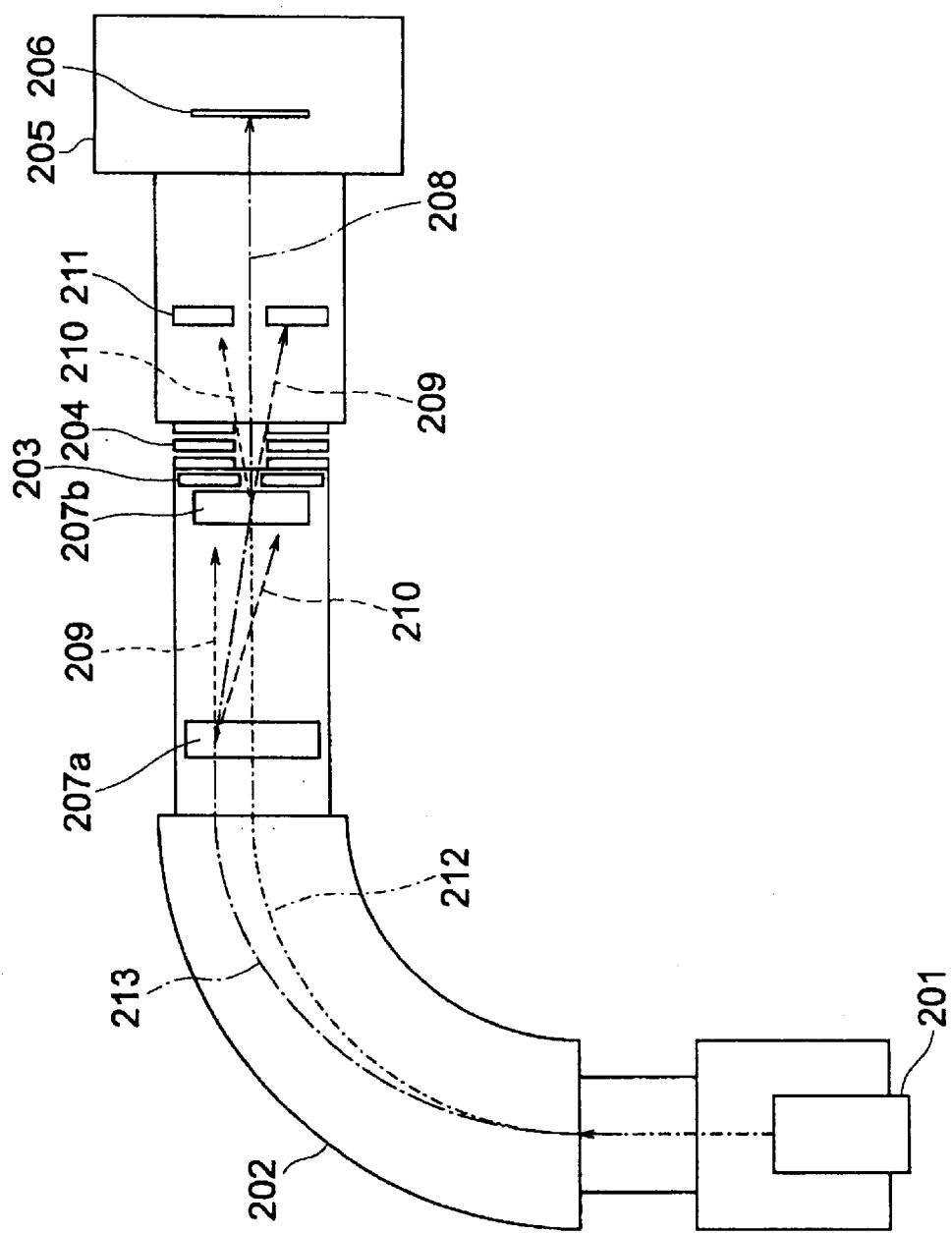
FIG. 5 shows a schematic view showing an ion implantation apparatus according to a second embodiment of this invention.

Referring to FIG. 5, description will be made about a second embodiment of this invention.

In FIG. 5, two stages of deflecting elements 207a and 207b are arranged between a mass-analyzing magnet 202 and an after-electrode portion 204 in minimum.

When the ion implantation apparatus is operated in post-deceleration or post-acceleration mode, a magnetic field of the mass-analyzing magnet 202 is set at a weaker state (or a stronger state) than the normal state.

In consequence, an ion beam from an ion source 201 comes from the mass analyzing magnet 202 along a trajectory 213 having a certain offset from the original beam trajectory 212.

Thereafter, the ion beam is deflected towards the original trajectory 212 by the first stage deflecting element 207a, and is returned back onto the original beam orbital 212 by the deflecting element 207b immediately before the post-stage electrode portion 204.

Particles neutralized from ions in the ion beam are not deflected by both electric field and magnetic field.

Particles neutralized from ions in an area of the upstream side are eliminated before the post-stage electrode portion 204. Alternatively, the neutralized particles collide with slits 211 even when they pass through the post-stage electrode portion 204.

In consequence, the neutralized particles finally do not reach a wafer substrate 206 in a wafer-processing portion 205. Herein, it is to be noted that the trajectory 209 represents a beam trajectory of the neutralized particles which are "not deflected" by the deflecting elements.

On the contrary, when the valence of the ion is increased by electron stripping, the ion receives stronger deflecting force than the ion having the desired valence.

Consequently, the ions are coming off from the trajectory of other normal ions, and are lost or eliminated before the post-stage electrode portion 204.

Alternatively, the ions collide with the slit 211 even when the ions pass the post-stage electrode portion 204, and finally do not reach the wafer substrate 206 in the wafer processing chamber 205. Herein, it is to be noted that the trajectory 210 represents a beam trajectory of the higher valence ions which are "largely deflected" by the deflecting elements.

In this method, the neutralized particles or higher valence ions generated until the final deflecting element 207b can be eliminated. Therefore, the first deflecting element 207a may be arranged far from the mass-analyzing magnet 202. However, the final deflecting device 207b must be arranged as close to the post-stage electrode portion 204.

In this method, when the ion implantation apparatus is not operated in post-deceleration or post-acceleration mode, it is unnecessary that the deflecting elements 207a and 207b are operated. In this case, the magnetic filed of the mass analyzing magnet 202 is set to a normal value such that ions are deflected on the normal trajectory 212. In this event, the mass analyzing slit 203 may have the function of a part of the post-stage electrode portion 204.

In the first and the second embodiments, a deflecting plane of the deflecting elements 107 and 207 may not always correspond to the deflecting plane of the mass analyzing magnets 102 and 202. This fact will not cause a principle problem.

However, in general, a deflecting direction of the deflecting elements 107 and 207 is most advantageously determined such that the ion beam is deflected on the same plane as the deflecting plane of the mass-analyzing magnets 102 and 202. This reason will be explained below.

Herein, it is assumed for explanation that the deflecting plane of the mass-analyzing magnets 102 and 202 is horizontal (namely, a height thereof is constant).

The ion beam converges on the deflecting plane after the beam passes the magnet in the general mass analyzing magnets 102 and 202. Further, narrow mass-analyzing slits 103 and 203 are arranged at the focal point. Thereby, the ions having different momentum can be efficiently analyzed by the slits.

Although a beam size (width) in the deflecting plane becomes minimum at the focal point, a beam size (a height) in a vertical direction for the deflecting plane is not always small.

Therefore, the mass-analyzing slit 103, 203 is normally provided as a narrow aperture whose height dimension is larger than the width.

When the deflecting direction of the deflecting elements 107, 207 is determined such that the ion beam is deflected in the same plane as the deflecting plane of the mass-analyzing magnets 102 and 202, the ion beam can not pass through the mass-analyzing slit 103, 203 having the narrow width even if deflecting angle by the deflecting elements is small.

By contrast, when the ion beam is deflected in the vertical direction for the deflecting plane of the mass analyzing magnet 102, 202, the ion beam can not be separated by the mass-analyzing slit 103, 203, unless the beam is deflected as much as the height of the mass-analyzing slit 103, 203 having a larger height dimension in comparison with the width.

Further, both magnetic field and electric field can be used for the additional deflecting elements 107, 207 in principle. However, the magnetic field is generally more advantageous. This reason will be described as follows.

That is, when the deflecting electric field is applied, the electrons, which can reduce the positive space charge of the ion beam, can not exist in the region the deflecting electric field is applied.

Consequently, the space charge effect strongly affects the ion beam itself, and the ion beam diverges. As a result, the transport efficiency decreases. In particular, the beam remarkably diverges by the space electric charge in the low energy region. Therefore, the magnetic field is essential for the apparatus equipped with post-deceleration to generate the low energy ion beam.

Third Embodiment

Figure 6:
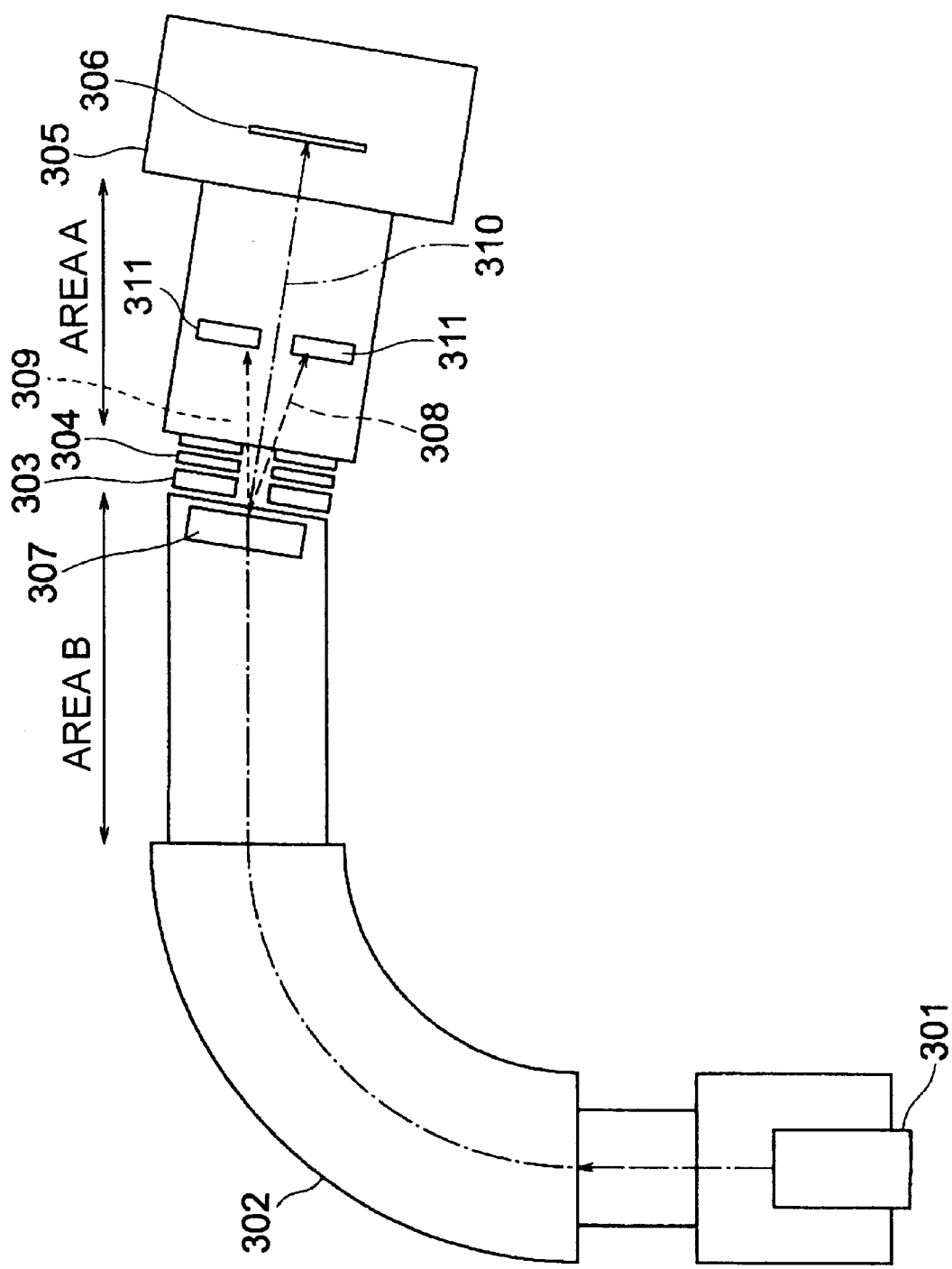
FIG. 6 shows a schematic view showing an ion implantation apparatus according to a third embodiment of this invention.

Referring to FIG. 6, description will be made about a third embodiment of this invention.

A single deflecting element 307 is arranged between a mass-analyzing magnet 302 and the post-electrode portion 304 in the third embodiment.

The deflecting element 307 is provided immediately before the mass-analyzing slit 303 in an area (region) B as illustrated in FIG. 6 while separating slits 311 are arranged in an area (region) A.

In FIG. 6, an ion beam is extracted from an ion source 301 and passes through the mass analyzing magnet 302. The ion beam is transported through the area (region) B, and is deflected to a desired beam trajectory 310 by the deflecting element 307 immediately before the mass analyzing slit 303.

The ion beam passing along a desired beam trajectory 301 reaches a wafer substrate 306 in a wafer-processing portion 305.

Particles neutralized from the ions are neither deflected by magnetic field nor electric field. Consequently, the particles, which neutralized in the upstream area of the deflecting device 307, are eliminated or lost before the post-electrode portion 304.

Alternatively, the neutralized particles collide with the slits 311 even when the particles pass the post-electrode portion 304, and finally do not reach the wafer substrate 306 in the wafer processing portion 305. Herein, it is to be noted that the trajectory 309 represents a beam trajectory of the neutralized particles which are "not deflected" by the deflecting element.

On the contrary, when the valence of the ion is increased by electron stripping, the ion receives stronger deflecting force than the ion having the desired valence.

Consequently, the ions are coming off from the trajectory of other normal ions, and are eliminated or lost before the post-stage electrode portion 304.

Alternatively, the ions collide with the slits 311 even when the ions pass the post-stage electrode portion 304, and finally do not reach the wafer substrate 306 in the wafer-processing chamber 305. Herein, it is to be noted that the trajectory 308 represents a beam trajectory of the higher valence ions which are "largely deflected" by the deflecting elements.

In this event, the mass analyzing slit 303 may have the function of a part of the post-stage electrode portion 304.

According to this invention, the energy contamination does not occur on the ion implantation apparatus equipped with post-deceleration/post acceleration almost.

In this event, the length of beam trajectory after post-deceleration/post-acceleration does not become long.

In particular, the generation of low energy ions by the post-deceleration can be freed from the problem of the energy contamination. In consequence, the deceleration ratio can be increased to increase the beam current.

Further, a switching operation, among the normal drift mode, the post-acceleration/post-deceleration mode and the post-acceleration/post-deceleration mode with the additional deflection, can be readily performed in order to cope with various implantation conditions widely.

Moreover, the deflecting elements can be arranged between the mass-analyzing device and the analyzing slit on the condition that the total trajectory length and structure of each component (member) is not changed. Thereby, the entire structure of the ion implantation apparatus is not almost changed, and the energy contamination can be eliminated.

While this invention has thus far been described in conjunction with several embodiments thereof, it will be readily possible for those skilled in the art to put this invention into practice in various other manners.

What is claimed is:

1. An ion implantation apparatus, comprising:

an ion source;

a mass-analyzing magnet which mass-analyzes an ion beam extracted from the ion source;

an accelerating/decelerating element which accelerates and decelerates the ion beam at a post-stage; and plural deflecting elements which are arranged additionally between the mass-analyzing magnet and the accelerating/decelerating element;

each deflecting element having an operation direction angle and having an operating deflection mode and a non-operating deflection mode both of which modes have a standard beam trajectory according to a regular ion implantation apparatus, and each operation direction angle being determined wherein a final beam trajectory of the ion beam in a predetermined area before being introduced into a wafer substrate is substantially identical in either the operating deflection mode or the non-operating deflection mode.

2. An apparatus as claimed in claim 1, further comprising:

a separating slit arranged at the downstream side on a beam trajectory of the accelerating/decelerating element to eliminate undesirable particles causing energy contamination.

3. An apparatus as claimed in claim 1, wherein:

a deflecting plane of the deflecting elements corresponds to a deflecting plane of the mass-analyzing magnet.

4. An apparatus as claimed in claim 1, wherein:

deflection due to the deflecting elements are carried out by the use of electric field.

5. An apparatus as claimed in claim 1, wherein:

deflection due to the deflecting elements are carried out by the use of magnetic field generated by an electromagnet.

6. An apparatus as claimed in claim 1, wherein:

the deflecting elements are composed of three stages such that the deflection operation is carried out three times, whereby, the final beam trajectory in the predetermined area before being introduced into the wafer substrate is matched to the trajectory of non-operating mode.

7. An apparatus as claimed in claim 1, wherein:

the deflecting elements are composed of two stages wherein a trajectory of the ion beam from the mass-analyzing magnet is on a trajectory offset from the normal standard beam trajectory of the regular ion implantation apparatus, whereby, preliminary deflection is carried out by the mass-analyzing magnet.

8. An apparatus as claimed in claim 1, wherein:

the beam trajectory is offset by setting magnetic field of the mass-analyzing magnet weaker or stronger than a normal value.

9. An apparatus as claimed in claim 1, wherein:

the deflecting elements include a first stage deflecting element and a second stage deflecting element, the mass-analyzing magnet deflects an ion trajectory around 90 degrees, the first stage deflecting element is arranged as close to the mass-analyzing magnet as possible, and the final stage deflecting element is arranged as close to an post-stage electrode portion as possible.

10. An apparatus as claimed in claim 2, wherein:

the accelerating/decelerating element is arranged immediately after the mass-analyzing slit.

11. An apparatus as claimed in claim 2, wherein:

the accelerating/decelerating element is arranged immediately after the mass-analyzing slit, and the separating slit is arranged at the predetermined distance from the accelerating/decelerating element.

12. An apparatus as claimed in claim 2, wherein:

the mass-analyzing slit is substantially matched with a focal point of the ion beam through the mass-analyzing magnet.

13. An apparatus as claimed in claim 12, wherein:

the deflecting elements are arranged adjacent to and prior to the mass-analyzing slit.

14. An apparatus as claimed in claim 12, wherein:

the mass-analyzing slit accelerates and decelerates the mass-analyzed ions.

* * * * *